United States Patent
Chen et al.

(10) Patent No.: US 6,992,909 B2
(45) Date of Patent: Jan. 31, 2006

(54) MULTI-BIT ROM CELL, FOR STORING ONE OF N>4 POSSIBLE STATES AND HAVING BI-DIRECTIONAL READ, AN ARRAY OF SUCH CELLS, AND A METHOD FOR MAKING THE ARRAY

(75) Inventors: Bomy Chen, Cupertino, CA (US); Kai Man Yue, Yuen Long N.T. (HK); Dana Lee, Santa Clara, CA (US); Feng Gao, Sunnyvale, CA (US)

(73) Assignee: Silicon Storage Techtology, Inc., Sunnyvale, CA (US)

( * ) Notice: Subject to any disclaimer, the term of this patent is extended or adjusted under 35 U.S.C. 154(b) by 0 days.

(21) Appl. No.: 11/157,318

(22) Filed: Jun. 20, 2005

(65) Prior Publication Data

US 2005/0231993 A1    Oct. 20, 2005

Related U.S. Application Data

(62) Division of application No. 10/642,079, filed on Aug. 14, 2003, now Pat. No. 6,927,993.

(51) Int. Cl.
    *G11C 17/00*    (2006.01)
(52) U.S. Cl. .................. 365/94; 365/104; 438/527
(58) Field of Classification Search ............. 365/94, 365/103, 104; 438/527
    See application file for complete search history.

(56) References Cited

U.S. PATENT DOCUMENTS 6,084,794 A * 7/2000 Lu et al. .............. 365/104

* cited by examiner

*Primary Examiner*—Anh Phung
(74) *Attorney, Agent, or Firm*—DLA Piper Rudnick Gray Cary US LLP

(57) ABSTRACT

A array of multi-bit Read Only Memory (ROM) cells is in a semiconductor substrate of a first conductivity type with a first concentration. Each ROM cell has a first and second regions of a second conductivity type spaced apart from one another in the substrate. A channel is between the first and second regions. The channel has three portions, a first portion, a second portion and a third portion. A gate is spaced apart and is insulated from at least the second portion of the channel. Each ROM cell has one of a plurality of N possible states, where N is greater than 2. The state of each ROM cell is determined by the existence or absence of extensions or halos that are formed in the first portion of the channel and adjacent to the first region and/or in the third portion of the channel adjacent to the second region. These extensions and halos are formed at the same time that extensions or halos are formed in MOS transistors in other parts of the integrated circuit device, thereby reducing cost. The array of ROM cells are arranged in a plurality of rows and columns, with ROM cells in the same row having their gates connected together. ROM cells in the same column have the first regions connected in a common first column, and second regions connected in common second column. Finally, ROM cells in adjacent columns to one side share a common first column, and cells in adjacent columns to another side share a common second column.

1 Claim, 10 Drawing Sheets

MULTI-BIT ROM CELL, FOR STORING ONE OF N>4 POSSIBLE STATES AND HAVING BI-DIRECTIONAL READ, AN ARRAY OF SUCH CELLS, AND A METHOD FOR MAKING THE ARRAY

CROSS-REFERENCE TO RELATED APPLICATIONS

This application is a divisional application of U.S. patent application Ser. No. 10/642,079 filed on Aug. 14, 2003 now U.S. Pat. No. 6,927,93 issued on Aug. 9, 2005, the subject matter of which is incorporated herein by reference.

TECHNICAL FIELD

The present invention relates to a multi-bit ROM cell for storing one of n (n>4) possible states, an array of such ROM cells and a method for making such an array. Further, the present invention relates to such a multi-bit ROM cell array in which each cell is read bi-directionally.

BACKGROUND OF THE INVENTION

A Read-Only Memory (ROM) cell is well known in the art. Typically, a ROM cell comprises a single MOS transistor having a first region, and a second region separated from one another by a channel. A gate is positioned over the channel and is insulated therefrom. A voltage is applied to the gate and the voltage controls the conduction of the channel. A single bit ROM cell means that the $V_{TH}$ or the voltage of the threshold by which the transistor turns on has been adjusted by an implantation step. When an appropriate voltage is applied to the gate, the source, and the drain, either the ROM cell is turned on or is turned off. Thus, the ROM cell is capable of storing a single bit.

A ROM cell capable storing multi-bits is also well known in the art. The advantage of a multi-bit ROM cell is that the density of the memory storage can be increased. Referring to FIG. 1, there is shown a typical process for manufacturing a ROM cell for storing one of a plurality of bits. The ROM cell 10 has a source 12, a drain 14 spaced apart from the source 12 and a channel 16 therebetween. The source 12 and drain 14 are in a substrate 20. Typically, the substrate 20 is of a p-type conductivity. Thus, the source 12 and drain 14 are of n-type. Of course, the substrate 20 can also be a well within the substrate 20. A gate 22 is spaced apart and insulated from the channel 16 by an insulation layer 24. If the ROM cell 10 is to store, e.g. two bits or four possible states, the ROM cell 10 would have to undergo potentially as many as three masking steps for implantation. One of the possible states for the ROM cell 10 is in which the $V_{TH}$ (designated as $V_{T1}$) is the highest. In that event, no additional implant of N type material is made into the channel region 16 thereby affecting the $V_{TH}$. The next higher level of $V_{TH}$ would be an implant of donor (n-) species into the channel region 16. A third and fourth state would be where yet even higher dosages of donor (n-) species are implanted into the channel, lowering $V_{TH}$. Thus, if the ROM cell 10 were to store one of a possible of four states representing two bits, potentially, as many as three additional mask steps would be required to implant the channel region 16 to change the $V_{TH}$ thereof. An array of multi-bit ROM cells is also well known in the art. However, similar to the foregoing description with regard to the manufacturing of a multi-bit ROM cell, the array is made with potentially as many as M-1 implants, with M as the total number of possible states.

An MOS transistor is also well known in the art. Typically, an NMOS transistor 30, such as the one shown in FIG. 2A, comprises a source region 32, a drain region 34 and a substrate 20. Again, the substrate typically is of P type conductivity and the source 32 and drain 34, are of N type. Again, the source 32 and drain 34 can be in a well, with the well in the substrate 20. Further, the conductivity of the source 32, drain 34 and of the substrate (or well) can be reversed, and the transistor 30 would be PMOS type. A channel 36 is between the source 32 and drain 34. As the scale of integration increases i.e., as the size of the MOS transistor 30 decreases, typically the channel region 36 will have three portions: each labeled as 1, 2 and 3 in FIG. 2A. A gate 22 is spaced apart from at least the second portion of the channel 36 by an insulation layer 24. Because of the scale of integration, LDD (lightly doped drain) structures 38 and 40 are formed in portions 1 and 3, with portion 1 located adjacent to and connected with the source region 32 and portion 3 located adjacent to and connected to the drain region 34. The second portion is between the first and third portions. The LDD like structures in portions 1 and 3, shown in FIG. 2A, are of the same type of conductivity as the source and drain 32 and 34, respectively. Thus, in the event the substrate 20 is of P type and the source and drain 32 and 34 are of N type, the LDD like structures (also known as "extensions") in portions 1 and 3 are also N type. The function of the extensions is to decrease the resistance between the source 32 and the drain 34, which increases the turn on current. Thus, a removal of either one or both of the extensions 38 and 40 in FIG. 2A would decrease the current flow between the source and drain.

In addition, because of the increased scale of integration, halo regions 42 and 44 have also been implanted into portions 1 and 3. A halo portion 42 or 44 is an increase in conductivity of the same type as the substrate 20. Therefore, again, if the substrate 20 is of the p-type, and the source and drain 32 and 34 are of n-type, with the extensions 38 and 40 also of n-type, the halo regions 42 and 44 are of p-type, but with a concentration greater than the substrate 20. The halo regions 42 and 44 prevent punch through. The effect of adding halo regions 42 and 44 is to increase the $V_{TH}$, which decreases the turn off current. Thus, removal of the halo regions 42 and 44 would reduce the $V_{TH}$ thereby increasing current flow between the source drain 32 and 34 respectively. This is shown in FIG. 2B. One can choose to include either the halo regions 42 and 44 or the extensions 38 and 40, or both by selecting the biases to emphasize one effect versus another effect. If standard CMOS masks are not used, however, then only one effect, i.e. either halo regions 42 and 44 or extensions 38 and 40 is chosen.

As can be appreciated, the formation of each of the extensions 38 and 40 and of the halo regions 42 and 44 requires an additional masking step.

Accordingly, it is one object of the present invention to make an array of multi-bit ROM cells in which the operations of implant and masking is reduced compared to the method of the prior art.

SUMMARY OF THE INVENTION

A multi-bit Read Only Memory (ROM) cell comprises a semiconductor substrate of a first conductivity type with a first concentration. The ROM cell has a first region of a second conductivity type in the substrate and a second region of the second conductivity type in the substrate, spaced apart from the first region. A channel is between the first region and the second region with the channel having three portions: a first portion, adjacent to the first region, a third portion adjacent to the second region, and a second portion between the first portion and the third portion. A gate is spaced apart and insulated from at least the second portion of the channel. The ROM cell stores one of a plurality of n (n>4) possible states, and is characterized by having one of a plurality of threshold voltages in the second portion. Further, for each threshold voltage the ROM cell has: (1) a first extension region in the first portion of the channel adjacent to the first region, with the first extension region being of a conductivity type or a concentration different from the first conductivity type and the first concentration, and the third portion of the channel adjacent to the second region being the first conductivity type having the first concentration; or (2) a second extension region in the third portion of the channel adjacent to the second region, with the second extension region being of a conductivity type or a concentration different from the first conductivity type and the first concentration, and the first portion of the channel adjacent to the first region being the first conductivity type having the first concentration; or (3) the first extension region in the first portion of the channel adjacent to the first region, with the first extension region being of a conductivity type or a concentration different from the first conductivity type and the first concentration, and the second extension region in the third portion of the channel adjacent to the second region with the second extension region being of a conductivity type or a concentration different from the first conductivity type and the first concentration; or (4) the first portion of the channel adjacent to the first region being the first conductivity type having the first concentration, and the third portion of the channel adjacent to the second region being the first conductivity type having the first concentration.

The present invention also relates to an array of the foregoing described multi-bit ROM cells.

The present invention also relates to an array of multi-bit ROM cells wherein the semiconductor substrate also has a MOS transistor with the MOS transistor formed during a masking operation. The one state of each ROM cell is made by a masking step which is also used to make the MOS transistor.

Finally, the present invention relates to a method of making such an array of multi-bit ROM cells. The method comprises implanting the substrate to form a plurality of spaced apart first regions of a second conductivity type, parallel to one another, in the column direction, in the substrate. Each first region is the common column line between adjacent columns of ROM cells. The array is selectively masked, to permit implanting a certain select of the ROM cells to be implanted to one of four possible states, depending upon whether the first portion or the third portion of the channel, if any, is implanted. Thereafter, the masked array is implanted to form the first, second, third or fourth state of the ROM cells. The array is also masked to permit implanting a fifth select of the ROM cells wherein for each ROM cell, implanting would occur in its associated second portion of the channel for setting the threshold voltage of the cell to one of a plurality of possible voltages. The array is then implanted to set the threshold voltages for the fifth select of said ROM cells.

DETAILED DESCRIPTION OF THE INVENTION

Figure 1:
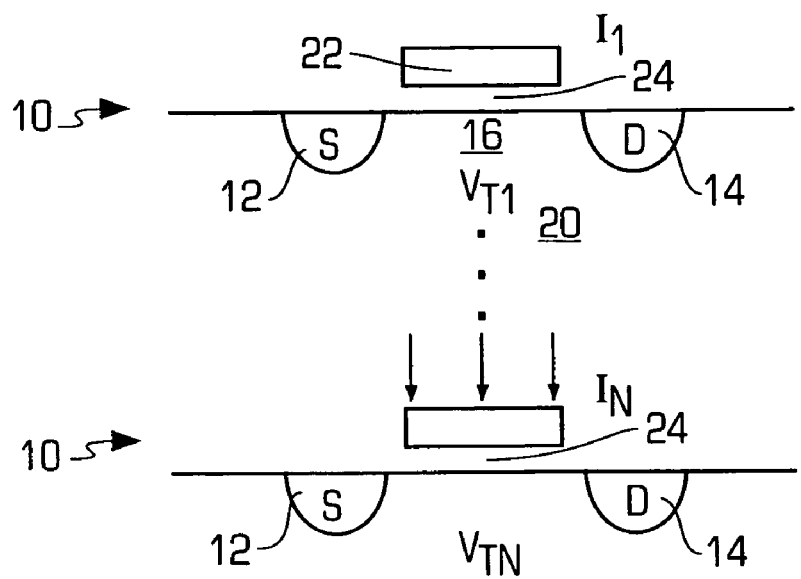
FIG. 1 is a schematic diagram showing the method of the prior art to make a multi-bit ROM cell.

Referring to FIG. 3, there is shown one example of an improved multi-bit ROM cell 50 in one of a possible of four states. The cell 50 is constructed in a semiconductor substrate 20 such as single crystalline silicon of the p-conductivity type, although it would be appreciated by those skilled in the art that n-conductivity type material can also be used. Further, as used herein, the term "substrate" can also include wells that are in substrates. The substrate 20 has a first conductivity type, such as p-type, having a first concentration level. The cell 50 comprises a first region 32 and a second region 34 spaced apart from one another and each being of a second conductivity type, such as n+ material, opposite the first conductivity type of the substrate 20. Between the first region 32 and the second region 34 is a channel 36 having three portions. A first portion is immediately adjacent to the first region 32. A third portion of the channel 36 is immediately adjacent to the second region 34, with the second portion between the first portion and the third portion. A gate 22 is spaced apart and insulated from the channel 36 by an insulation layer 24 and overlies at least the second portion of the channel 36.

The ROM cell 50 has a certain threshold voltage in the substrate 20 in the second portion of the channel. For each threshold voltage, the ROM cell 50 can have one of four possible states. In the first possible state, shown in FIG. 3A, the first portion and the third portion of the channel 36 each has the same conductivity type and concentration as the conductivity type and concentration of the substrate 20. A second state is shown in FIG. 3B. In the second possible state, an extension 40, of a second conductivity type, is in the third portion and is connected to and is immediately adjacent to the second region 34, which also is of the second conductivity type. Typically, the extension 40 has a lighter concentration of the second conductivity type than the second region 34. However, this limitation is not necessary, so long as the extension 40 with the second conductivity type is present thereby changing the Vth or the conductivity of the ROM cell 50 from that of the first state shown in FIG. 3A. The first portion continues to have the first conductivity type with the first concentration, the same as the substrate 20. A third possible state shown in FIG. 3C. In this state, an extension 38 is in the first portion of the channel 36 and is immediately adjacent to and connected to the first region 32. The extension 38 is of the second conductivity type, same as the first region 32. The third portion of the channel 36 has the same conductivity type and concentration as the substrate 20. A fourth and final state is shown in FIG. 3D. In this state, a first extension 38 of the same conductivity type as the first region 32 is in the first portion of the channel 36 and is immediately adjacent to and connected to the first region 32. A second extension 40 also of the second conductivity type is immediately adjacent to and connected to the second region 34 and is in the third portion. Thus, for a plurality of different threshold voltages in the substrate 20 in the second portion of the channel, there would be n possible states with n>4.

Figure 3A:
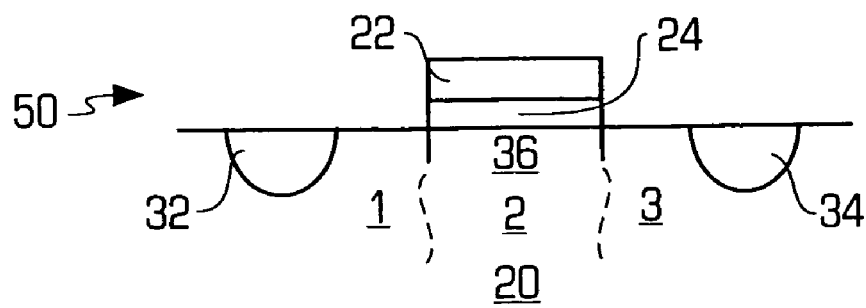
FIGS. 3A–3D are schematic diagrams of one example of an improved ROM cell having four possible states.
Figure 3B:
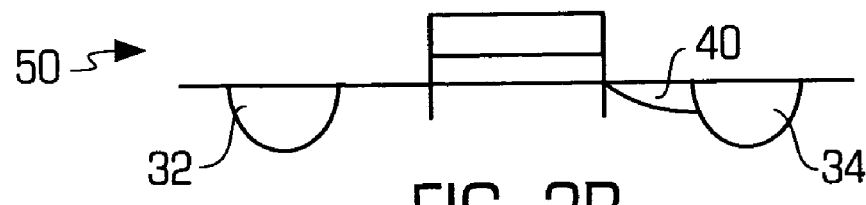
Figure 3C:
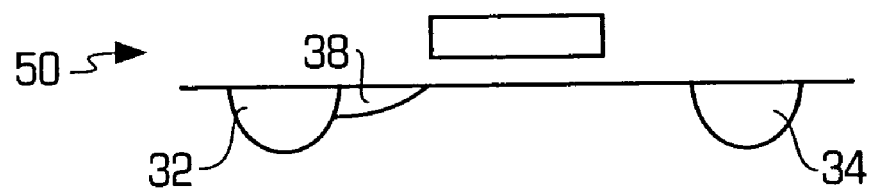
Figure 3D:
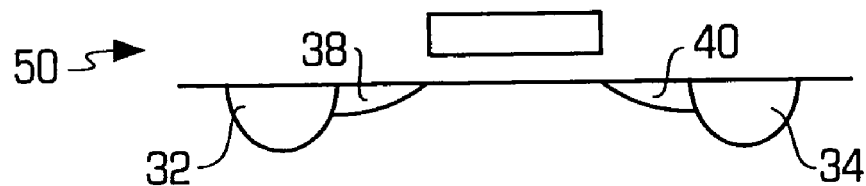
Figure 4A:
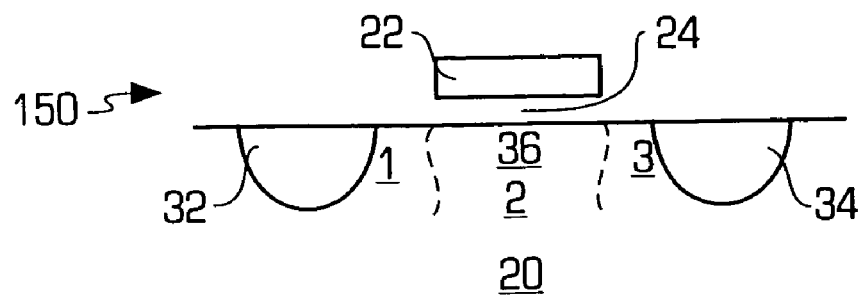
FIGS. 4A–4D are schematic diagrams of another example of an improved ROM cell having four possible states.
Figure 4B:
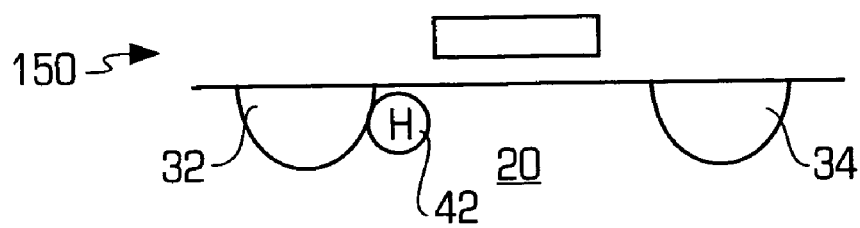
Figure 4C:
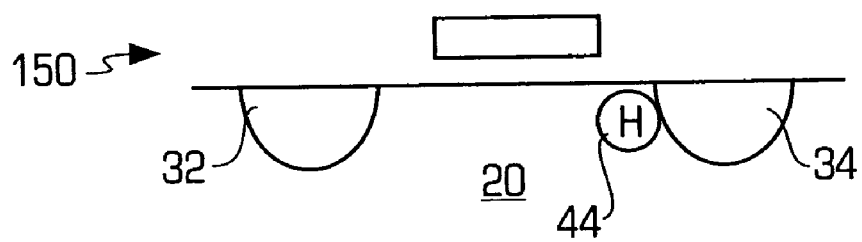
Figure 4D:
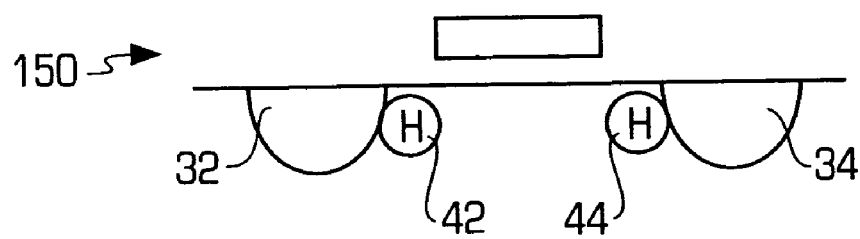

Referring to FIG. 4, there is shown another embodiment of a multi-bit ROM cell 150 for storing one of a plurality of states. The ROM cell 150 is similar to the ROM cell 50 shown and described in FIGS. 3A–3D. The ROM cell 150 comprises a first and second regions 32 and 34 spaced apart from one another of a second conductivity type in a semiconductor substrate 20 of a first conductivity type having a first concentration. A channel 36 is between the first and second regions 32 and 34. The channel has three portions with a first portion adjacent to the first region, a third portion adjacent to the second region, and a second portion between the first and third portions. A gate 22 is spaced apart and is insulated from at least the second portion of the channel 36 by the insulation material 24. The ROM cell 150 has a certain threshold voltage in the substrate 20 in the second portion of the channel. For each threshold voltage, the ROM cell 150 can have one of four possible states described as follows:

In the first possible state, the first portion and the third portion of the channel 36 are of the first conductivity and first concentration, the same as the substrate 20, and is of the same state shown and described in FIG. 3A.

In the second possible state, a halo 42 is implanted and is formed in the first portion of the channel 36 and is adjacent to the first region 32. The halo 42 is of the first conductivity type as the substrate 20, but has a higher concentration than the substrate 20. The third portion of the channel 36 remains of the first conductivity type having a first concentration the same as the substrate 20.

In the third possible state, a second halo 44 is formed in the third portion of the channel 36. The halo 44 is of the first conductivity type but has greater concentration than the concentration of the substrate 20. The first portion of the channel 36 remains at the first conductivity type with the same concentration as the substrate 20.

Finally, in the fourth possible state, halos 42 and 44 are formed in the first and third portions of the channel 36 with each of the halos 42 and 44 being of the first conductivity type with a concentration greater than the concentration of the semiconductor substrate 20.

Thus, for a plurality of different threshold voltages in the substrate 20 in the second portion of the channel, there would be n possible states with n>4.

Referring to FIG. 5, there is shown a series of schematic diagrams showing how the ROM cell 50 or 150 can be read to determine its state. For the purposes of illustrating the read operation, it is assumed that the ROM cell 50 is of the type shown as described in FIGS. 3A–3D, i.e. extensions 38 and 40 are selectively implanted, depending upon the state of the ROM cell 50, with the threshold voltage in the second portion of the channel at a certain level. Initially, if the substrate 20 is of the P conductivity type, and the threshold voltage in the second portion of the channel at a certain level, a positive voltage, such as 3.3 volts, needs to be applied to the gate 22. In addition, ground or $V_{SS} < V_{DD}$ is applied to the first region 32 and $V_{DD}$ or +3.3 volts is applied to the second region 34. The application of a positive voltage to the second region 34 causes a depletion region 48 to be formed around the second region 34. The limits of the depletion region 48 is shown as a dotted line 47 in FIGS. 5A–5D. If the ROM cell 50 were in the first state, i.e., no extension regions were formed in either the first portion or the third portion of the channel 36, then the resistance of the channel 36 is determined by the distance from the edge of the first region 32 to the limit 47 of the depletion region 48 formed about the second region 34, in series with the threshold voltage of the second portion of the channel. This total resistance determines the $V_{TH}$. However, as can be seen in FIG. 5C, even if the ROM cell 50 were in the third state where a second extension 40 were formed (by implantation or other method) in the third portion of the channel adjacent to the second region 34, the depletion region 48 would overcome the second extension 40. Thus, the distance between the first region 32 and the edge 47 of the depletion region 48 would be the same for the case where the ROM cell 50 were programmed to a state shown in FIG. 5A or to a state shown in FIG. 5C. both of these states would exhibit the same $V_{TH}$ (assuming the same threshold voltage in the second portion of the channel) and would have substantially the same current flow under the conditions of $V_{DD}$ applied to second region 34, $V_{SS}$ applied to first region 32, and a positive voltage such as $V_{DD}$ being applied to the gate 22.

For the other two possible states (shown in FIGS. 5B and 5D), however, i.e., where the first extension 38 is formed in the first portion of the channel 36 and is adjacent to the first region 32, the distance between the edge of the first extension 38, closest to the second region 34 and to the outer edge 47 of the depletion region 48, is substantially reduced. Under this condition, the $V_{TH}$ is less than $V_{TH}$ of the states shown in FIGS. 5A and 5C (again assuming the threshold voltage for the second portion of the channel is the same). Thus, under the condition of the same voltage applied to the regions 32, 34 and gate 22, as for the first case above, the current flow measured would be higher than the two states shown in FIG. 5A or 5C.

Figure 5A:
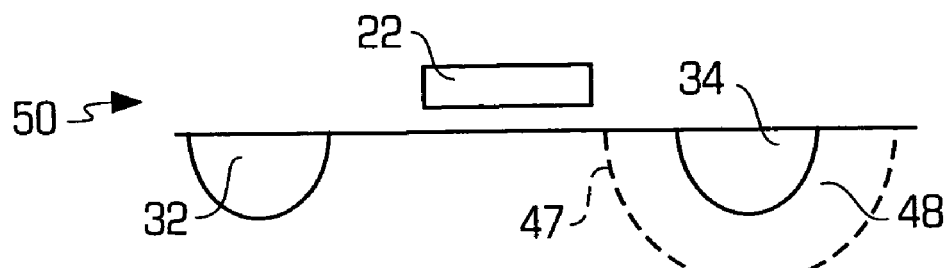
FIGS. 5A–5D are schematic diagrams showing the operation of a read method to detect the state of a ROM cell of the type shown in FIGS. 3A–3D.
Figure 5B:
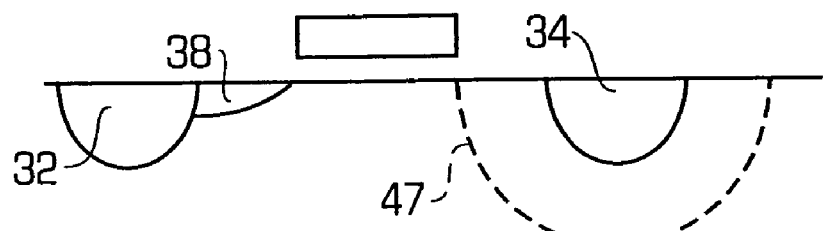
Figure 5C:
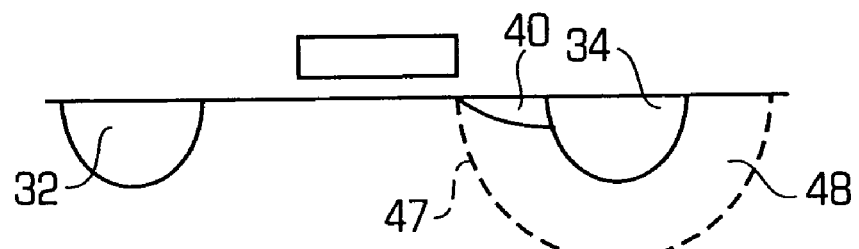
Figure 5D:
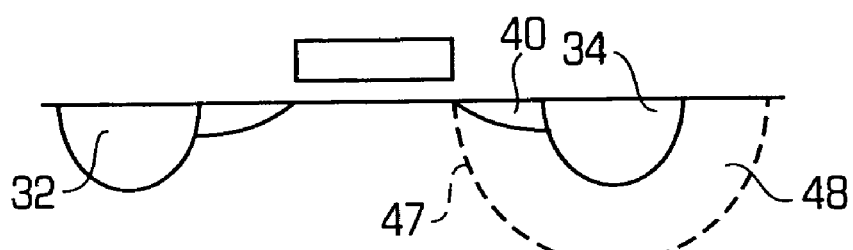

Therefore, when $V_{DD}$ is applied to second region 34 and to the gate 22 and $V_{SS}$ applied to first region 32, two possible current flows may be detect for either the states shown in FIGS. 5A and 5C or for the state of the ROM cell 50 shown in either FIG. 5B or 5D. Based upon this current flow detected, states shown in FIGS. 5A and 5C are differentiated from the states shown in FIGS. 5B and 5D.

Assume for the moment that the current flow is low, indicating that the ROM cell 50 is in either of the states shown in FIG. 5A or 5C compared to the states shown in FIG. 5B or 5D, the read method continues to differentiate between states shown in FIG. 5A and FIG. 5C, by reversing the voltages applied to the first and second regions 32 and 34. The voltage of $V_{DD}$ would then be applied to the first region 32 and to the gate 22 and the voltage of $V_{SS}$ would be applied to the second region 34. A depletion region would be formed about the first region 32. Since for the case of the ROM cell 50 being in the state shown in FIG. 5C, the $V_{TH}$ is less than the $V_{TH}$ of the state shown in FIG. 5A, the ROM cell 50 being in the state shown in FIG. 5C would generate a higher current than the ROM cell 50 being in the state shown in FIG. 5A. The current flow measured with the application of these voltages would then determine whether the ROM cell 50 is in the state determined by FIG. 5A or 5C.

Figure 2A:
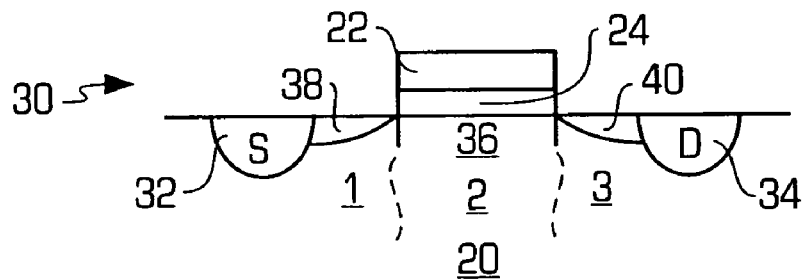
FIGS. 2A and 2B are schematic diagrams showing a method of making an MOS transistor of the prior art.
Figure 2B:
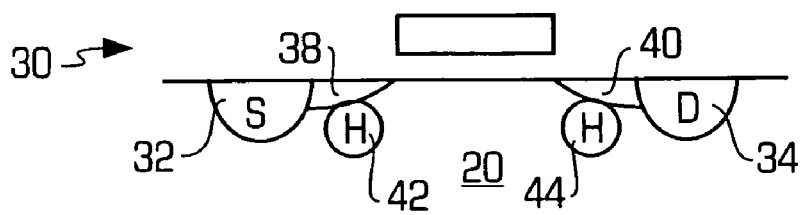

As can be seen from the foregoing, with the ROM cell 50 or 150 and the formation of either the extension 38 or 40 or the halo 42 or 44, the extension or halo can be formed at the same time as the formation of the extension or halo in a conventional MOS transistor, such as shown and described in FIGS. 2A and 2B. Therefore, in any integrated circuit device having a ROM cell, with MOS transistors (such as those used a decoding circuit or sensing circuit or the like) where the MOS transistors require the formation of extensions or halos, the formation of the state of a ROM cell 50 or 150, can be made at the same time as the masking operation which is used to form the halo or the extensions of a MOS transistor. This would reduce the cost in the formation of the ROM cell 50 or 150. Further, by changing the threshold voltage of the second portion of the channel, by, e.g. implanting N type material to increase the Vth in the second portion of the channel, the number of states that can be stored in a ROM cell 50 or 150 can be one of n states, where n is greater than 4.

To differentiate the states associated with one threshold voltage for the second portion of the channel, from states associated with another threshold voltage for the second portion of the channel, assume that there are two possible threshold voltages for the second portion of the channel: 1.5 volts, and 2.0 volts. Thus, there are a possible of 8 total states of storage. In the first method, 2.0 volts is applied to the gate 22. If the ROM 50 or 150 has a threshold voltage in the second portion of the channel at 2.0 volts, then irrespective of the voltages applied to source 32 and drain 34, no current flow (or insignificant current flow) would occur between the source 32 and drain 34 (or vice versa). Then applying 3.3 volts to the gate 22 would cause current flow between the source 32 and drain 34 and reversing the voltages applied would determine one of the possible 4 states. If the ROM 50 or 150 has a threshold voltage in the second portion of the channel at 1.5 volts, then applying Vdd and Vss to source 32 and drain 34 and 2.0 volts to the gate 22, would cause a small amount of current to flow. However, applying the same Vdd and Vss to source and drain 34 and 3.3 volts to gate 22 would cause more current to flow. Thus, the four states of the ROM 50 or 150 with the threshold voltage of the second portion of the channel at one level can be distinguished from the four states of the ROM 50 or 150 with the threshold voltage of the second portion of the channel at another level, based upon the amount of current flow.

Figure 6:
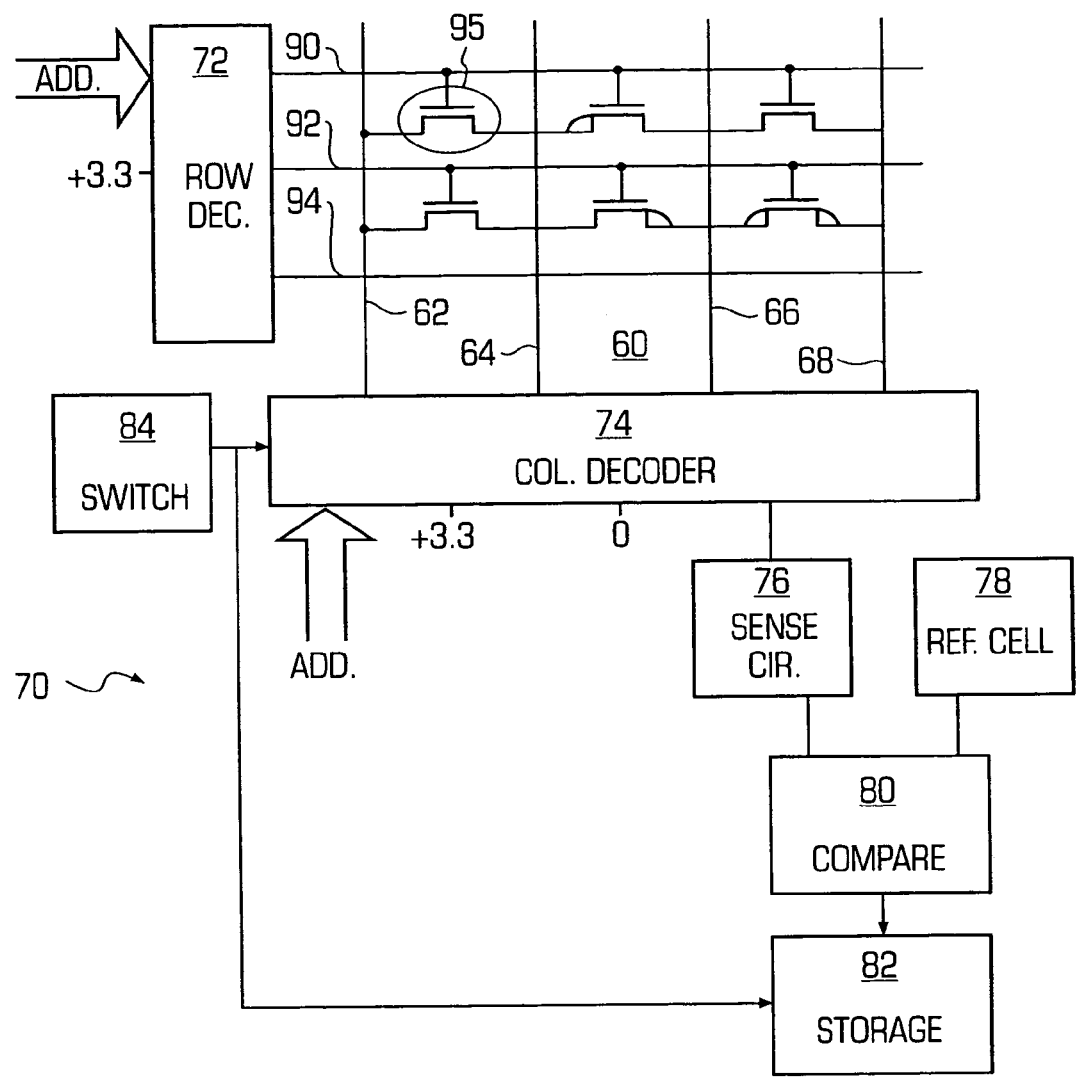
FIG. 6 is a circuit diagram of an array of ROM cells with appropriate switches and sensing circuits to read a select ROM cell.

Referring to FIG. 6 there is shown a schematic circuit diagram of a ROM device 70 having an array 60 of ROM cells 50 or 150. The array 60 of ROM cells are arranged in a plurality of rows and columns. A plurality of rows 90, 92, 94 are attached to the gate of the ROM cells in each of the respective rows. Thus, the gates of all the ROM cells in the same row are electrically connected together. A plurality of column lines 62, 64, 66 and 68 are connected to the first regions 32 of all the ROM cells that are arranged in the same column. The column line 62, 64, 66 and 68 also connect all the second regions 34 of the ROM cells that are arranged in the same column. As can be seen from FIG. 6, each column of ROM cells that are adjacent to one another share a common column line which is connected to the second regions 34. Thus, the column line 64 is connected to the second regions of the ROM cells located in the column between the column lines 62 and 64 and to the second regions 34 of the ROM cells located in the column between the column lines 64 and 66. Further, the column line 66 is connected to the first regions 32 of the ROM cells located in the column between the column lines 64 and 66 and the column line 66 connects all of the first regions 32 of the ROM cells located in the column between the column lines 66 and 68. As can be appreciated, the terms first regions 32 and the second regions 34 may be interchanged. Further, as can be seen from FIG. 6, the array 60 comprises a plurality of ROM cells with each ROM cell being programmed to one of a plurality of different states. Thus, for example, as shown in FIG. 6, the ROM cell whose gate is connected to row line 90 and whose first and second regions are connected to column lines 64 and 66 is indicated as having an extension region connected and adjacent to the column line 64. (As used herein, including the claims, the term "extension region" means an extension 38 or 40 or a halo 42 or 44). Similarly, the ROM cell whose gate is connected to row line 92 and being connected to column lines 64 and 66, has an extension region which is connected to the column line 66. Finally, the ROM cell whose gate is connected to row line 92, but whose first and second regions are connected to column lines 66 and 68, has extension regions connected to both column lines 66 and 68. As previously discussed, these three examples of ROM cells all "store" states that are different from one another.

The device 70 also comprises a row decoder 72 which can be connected to a number of voltage source such as +3.3, +2.0 volts, or to +3.3 volts, and then through a voltage divider +2.0 volts is generated. The row decoder 72 receives an address signal and decodes and selects one of the row lines 90, 92 or 94 and supplies the +3.3 or +2.0 volts to that row line. The device 70 also comprises a column decoder 74. The column decoder 74 is connected to the column lines 62, 64, 66 and 68. The column decoder 74 is also connected to $V_{DD}$ which is at +3.3 volts and $V_{SS}$ which is at 0 volts. The column address decoder 74 also receives address signals which when decoded selects a pair of column address lines, such as 62/64 or 64/66 or 66/68. The pair of column address lines selected must be of adjacent column address lines.

The device 70 also comprises a sensing circuit 76. The sensing circuit 76 measures the amount of current flow between the first and second regions 32 and 34 of a selected ROM cell. That current flow is then compared to the current flow measured detected from a reference cell 78 and is compared by a comparator 80. The result of the comparator 80 is stored in a storage 82. Further, the device 70 comprises a switch 84 for switching the pair of selected columns in the column decoder and for switching the storage locations in the storage 82.

In the operation of the device 70, when an address signal is supplied to the row decoder 72, a particular row address line, such as row address lines 90, 92 or 94 is selected. The voltage of +3.3 (or a different amount) is then supplied by the row address decoder 72 to the selected row address line, such as line 90. The column address decoder 74 receives the address signal and decodes them and selects a pair of adjacent column lines. For example, if the column address decoder 74 determines that the pair of column lines 62/64 are selected, then the column address decoder 72 applies, for example, the voltage +3.3 volts to the column address line 62 and the voltage of 0 volts to the column address line 64. The sensing circuit 76 measures the amount of current flowing through the selected ROM cell 95 between the column 62 and column 64. The sensing circuit 76 measures the current flow on the column line 62. The amount of current flow measured is then compared to the amount of current flow measured flowing through a reference cell 78. This comparison is performed by a comparator 80 and the result of the comparison, as previously discussed, is a pair of possible states which is then stored in the storage 82. Thereafter, the switch 84 reverses the voltages applied to the pair of selected column lines 62/64. The voltage applied to the column line 62 would then be 0 volts, while column line 64 would receive the voltage of +3.3 volts. The current sensed flowing along the column line 64 is then measured by the sensing circuit 76. This measurement of the second current flow is compared again to the current flow through the reference cell 78 by the comparator 80. The result is that the comparator 80 selects one of the states that is stored in the storage 82. This then forms the output of the reading of the selected ROM cell 95. Alternative schemes in which any voltage or current property that is sensitive to the threshold voltage at the portion adjacent to the region along the lower-voltage column can be constructed by those familiar with the art of circuit design.

Figure 7A:
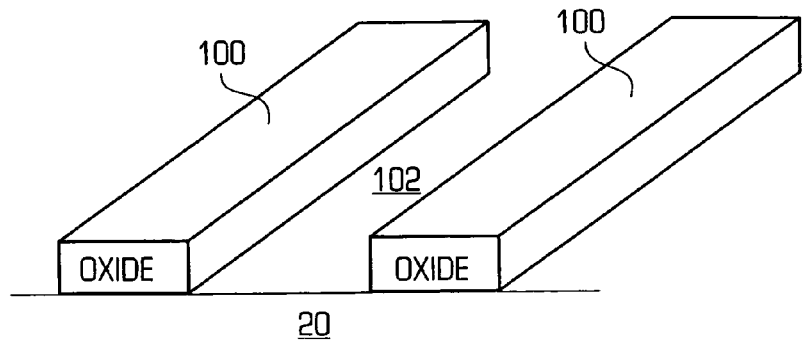
FIGS. 7A–7L are cross-sectional, perspective diagrams showing a process of making an ROM array with each ROM cell having one of a plurality of possible states.

Referring to FIG. 7A there is shown a perspective view of a first step of a method to make the ROM array 60 of the device 70. In the first step, spaced apart strips of silicon dioxide 100 are formed on a planar surface of the semiconductor substrate 20, which is of P conductivity type. The strips 100 of silicon dioxide are formed in a direction substantially parallel to the direction in which the column lines 62, 64, 66 and 68 are eventually formed. The spaced apart oxide strips 100 can be formed by the well-known masking step in which portions of an oxide layer are removed. The portions 102 which are the spaced apart regions between adjacent oxide layers 100 are removed by photolithography etching processes. The strips 100 of silicon dioxide are of approximately 1000 angstroms in thickness. The distance 102 by which adjacent strips 100 are spaced apart from one another determines the dimension of the first region 32 or second region 34.

Figure 7B:
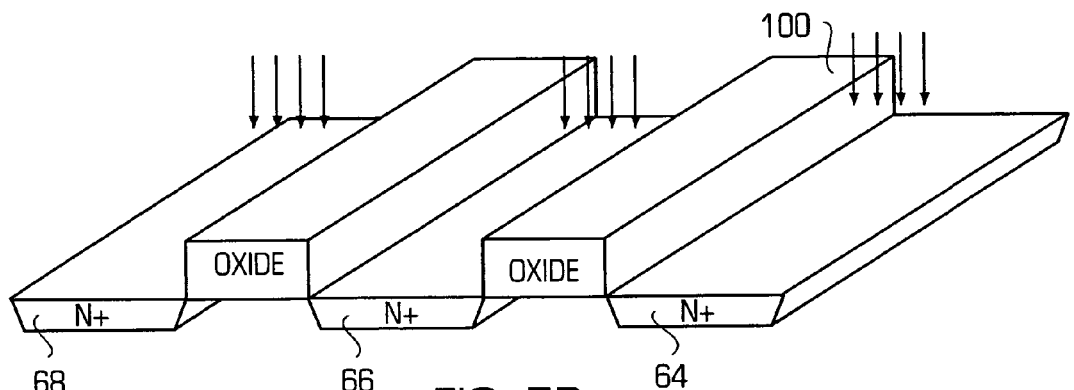

In the next step, shown in FIG. 7B, N+ species are implanted into the substrate 20 to form the column line 62/64/66/68. Since the implant is chosen so that its energy cannot penetrate the oxide strips 100, the implant is made in only those regions where the silicon substrate 20 is exposed. In the event the substrate is of a P conductivity type, the implant would be of the N species type. Prior to the N+ implant, the silicon substrate 20 may be optionally recessed to increase the L(eff). This optional step is to perform a silicon etch which is selective to the oxide strips. This will place the columns lines 62/64/66/68 within a trench thereby extending the surface distance between them.

Figure 7C:
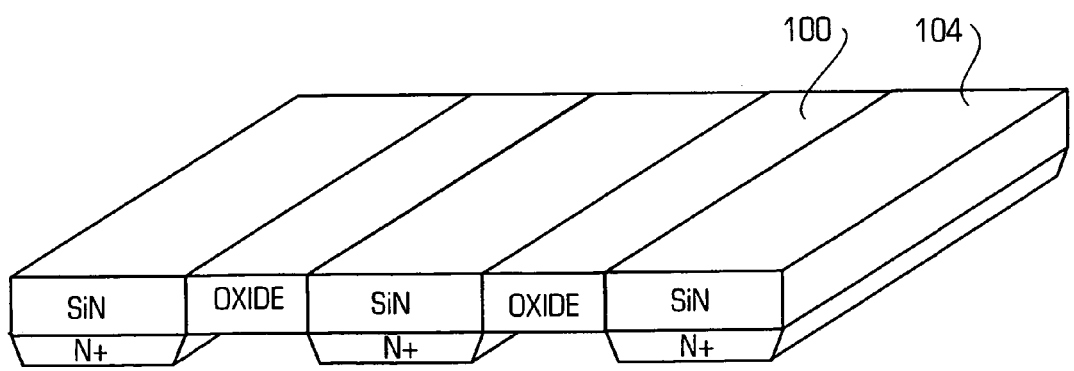

Referring to FIG. 7C there is shown the next step in the method of making the array 60. Silicon nitride 104 is deposited on the column line 64/66/68 etc. This can be done, for example, by depositing silicon nitride 104 everywhere and then using CMP polishing to planarize the structure to stop with the surface of the silicon dioxide 100. Another layer of silicon nitride 106 is then added to the structure shown in FIG. 7C. The result is the structure shown in FIG. 7D.

Figure 7D:
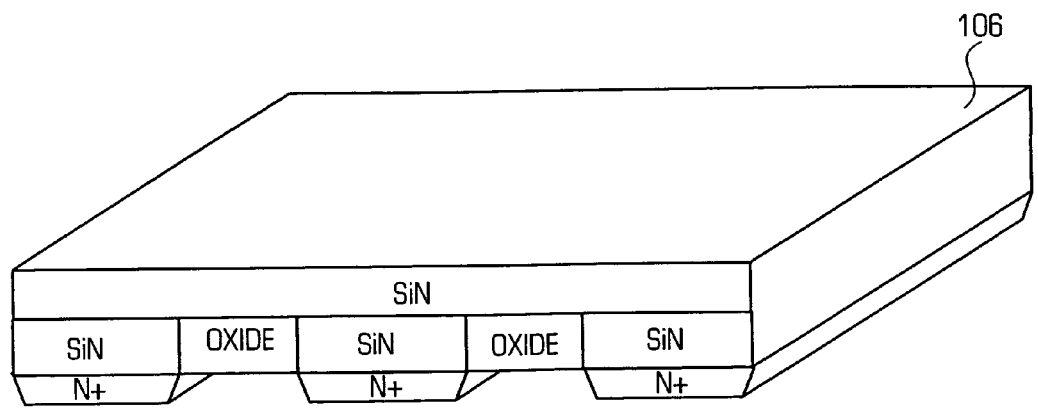
Figure 7E:
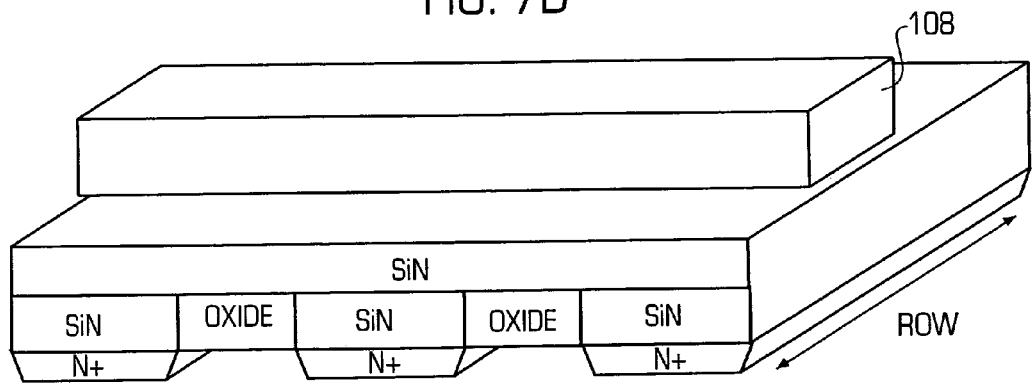

Photoresist 108 is then applied in the row direction of the structure shown in FIG. 7D. Photoresist in stripes 108 are deposited in spaced apart locations from one another. The photoresist 108 is patterned to open areas where the active ROM cells are to be made. The result is shown in FIG. 7E.

Figure 7F:
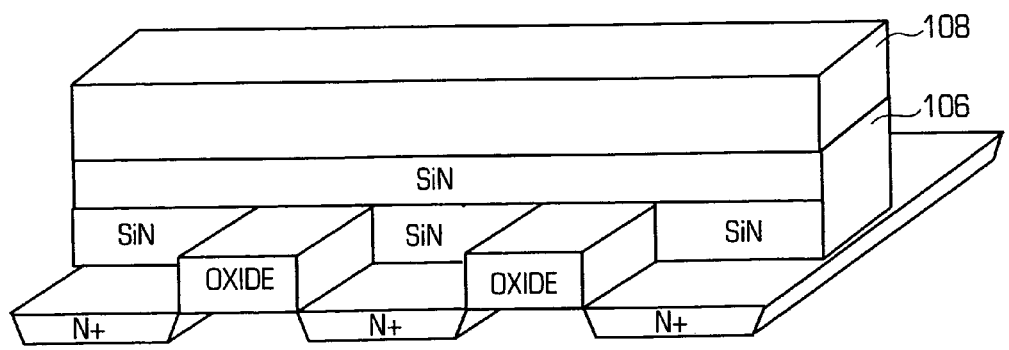

Using the photoresist 108 as a mask, the portion of the silicon nitride 106 that is exposed, i.e., between regions of photoresist 108, and the silicon nitride 104 that covers the column lines 62/64/66/68 are removed. This removal can be done by anisotropic etching of silicon nitride 106 and 104 between the photoresist strips 108. The resultant structure is shown in FIG. 7F.

Figure 7G:
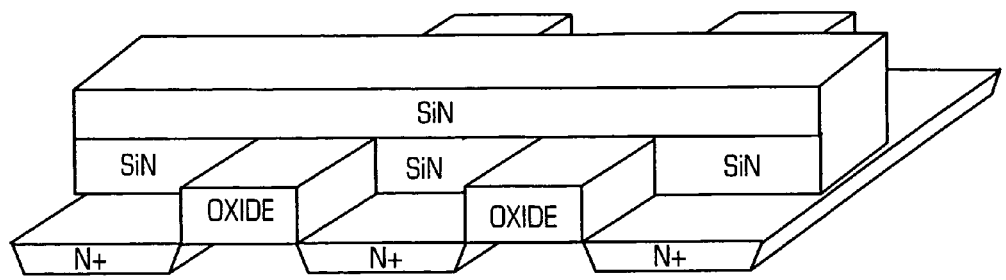
Figure 7H:
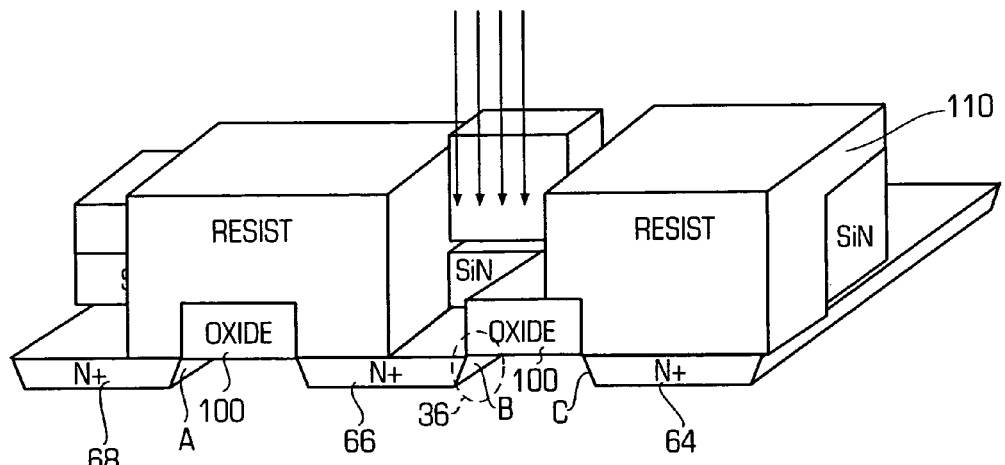

The photoresist strips 108 are then removed. The resultant structure is shown in FIG. 7G. A mask 110 is then placed over the structure. The mask 110 is the same mask that is used to make the MOS transistors in other parts of the device 70, such as the sense circuit 76, column or row address decoders 74 and 72 respectively, the reference cell 78, etc. to form either the halos or the extension in the MOS transistors in other parts of the device 70. The mask 110 is placed over selected areas such that the implants that follows to form the MOS transistors would also form the appropriate state of the ROM cell to one of a plurality of N possible states. As shown in FIG. 7H, the mask is placed over the entire oxide region 100 of the ROM cell that is between column lines 68/66. Thus, that ROM cell would receive a state in which the first and third portions of the channel immediately adjacent to the first and second regions are of the same conductivity and concentration as that of the substrate 20. Also shown in FIG. 7H is the ROM cell defined by the region between the column lines 66/64. The oxide layer 100 is shown as partially exposed (exposed on the left hand side). In this configuration, the ROM cell defined by the oxide layer 100 and the column lines 66/64 would have the portion of the channel immediately adjacent to the column line 66 be implanted with a species. In this example, halo implant is desired and accordingly, the species that is of the same type as the substrate 20 (namely P type) is then implanted into the exposed area of the mask 110. This would result in P+ species being implanted through the column 66 and into the first portion of the channel 36. The right portion of the ROM cell defined by the oxide layer 100 and the column lines 66/64 would remain covered and not be subject to the implant. Thus, the portion of the channel 36 immediately adjacent to the column line 64 would remain of the same type of conductivity and concentration as the substrate 20.

Figure 7I:
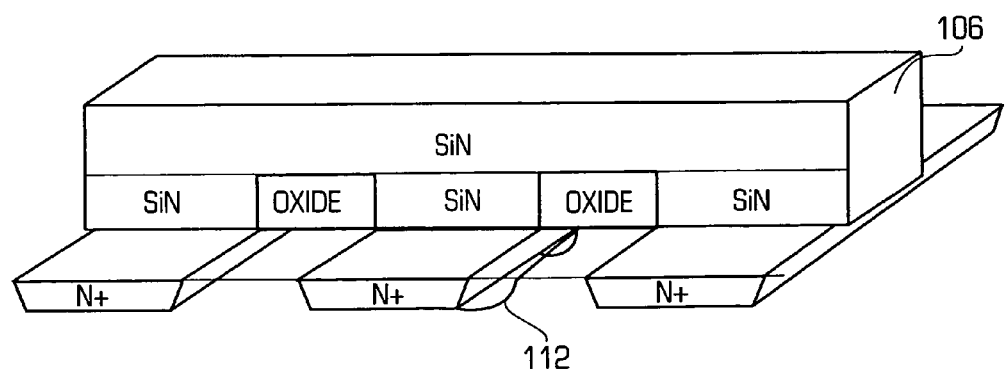

After the implant step, the mask 110 is removed. In addition, the oxide 100 which is in the exposed region between the spaced apart strips of silicon nitride 106 is also removed. The resultant structure is shown in FIG. 7I. Of course, the implant step described and shown in FIG. 7H may also be done after the oxide 100 has been removed from the exposed portion between the spaced apart strips of silicon nitride 106. The area where the implant has caused the change in the conductivity and/or the concentration of the species in the substrate 20 is designated as area 112, and is shown in FIG. 7I.

A photoresist mask (not shown) is placed over the structure shown in FIG. 7I. The mask would cover all the source/drain lines 64/66/68, and all the portions of the cells which is not desired to implant to change the threshold voltage of the second portion of the channel. To decrease the threshold voltage for the cells 50 or 150 desired, n dopant species is implanted into at least the second portion of the channel for the selected cells. To increase the threshold voltage for the selected cells 50 or 150, p dopant species is implanted into at least the second portion of the channel. Of course, the dopant (n or p) can be implanted into the entire channel region of the selected cells 50 or 150. This masking and implant step is the same mask and implanting step that is used to set the threshold voltage for the MOS transistors in other parts of the device 70.

Figure 7J:
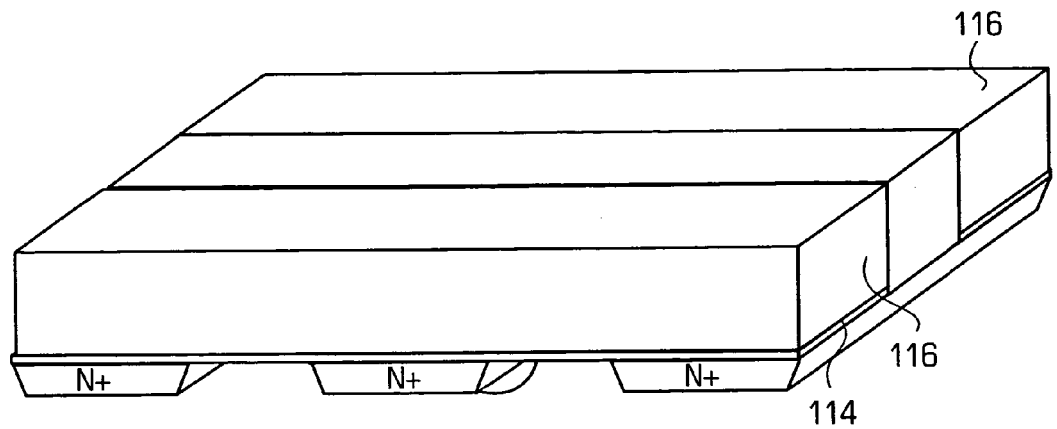
Figure 7K:
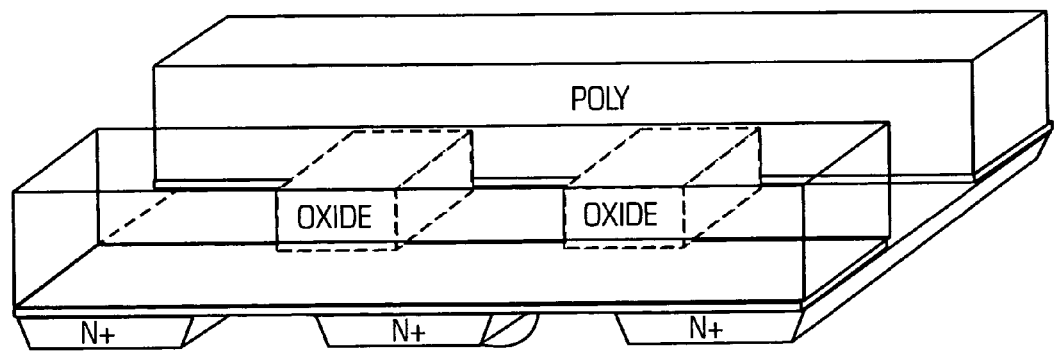
Figure 7L:
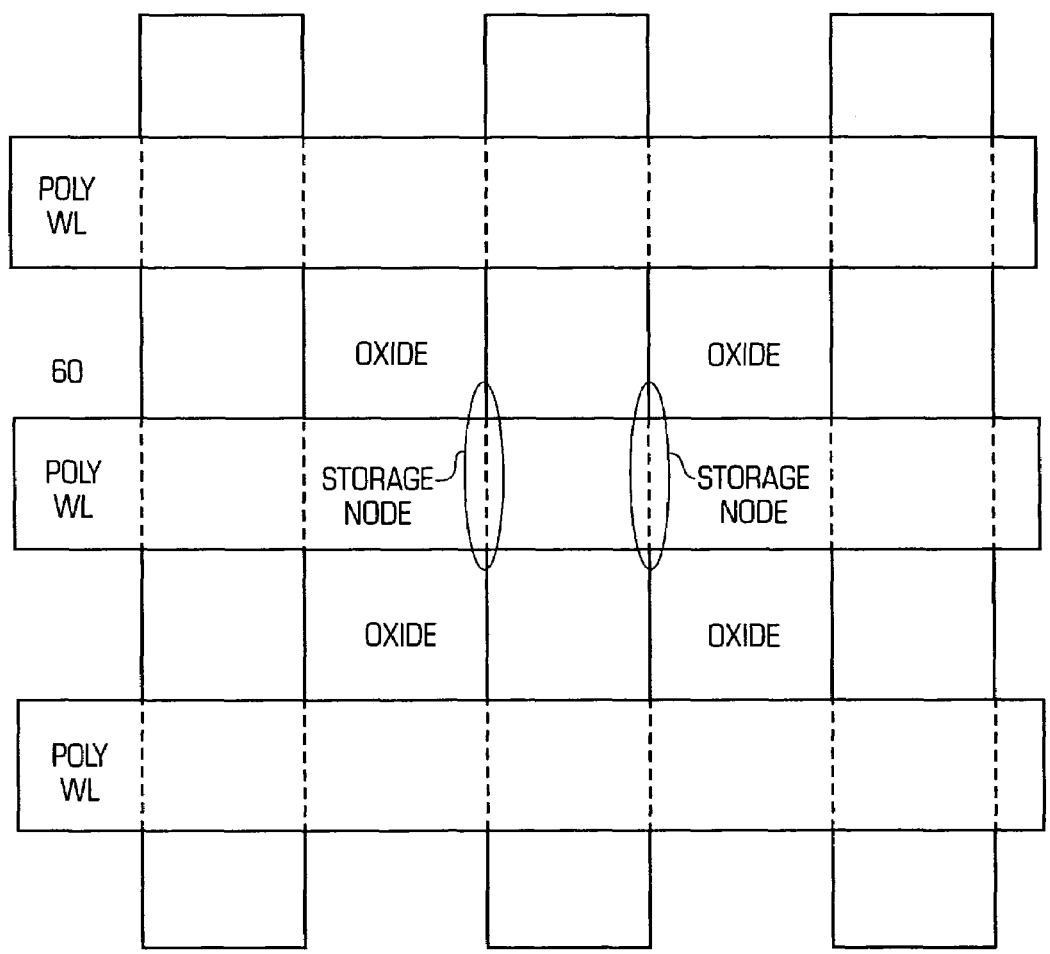

Thereafter, silicon dioxide 114 forming the gate oxide of the ROM cell is then deposited or formed in the exposed portion of the spaced apart silicon nitride strips 106. After the strips of gate oxide 114 are formed, polysilicon 116 is then deposited all over the structure. The polysilicon 114 is then subject to a CMP polishing step with the silicon nitride strips 106 as the etch stop. The resultant structure is shown in FIG. 7J. Each strip 116 of polysilicon as will be appreciated forms the gate of the ROM cells and the polysilicon 116 connect all the gates in the row direction. Thereafter, the silicon nitride 106 strips, which are between adjacent strips of polysilicon 116 are then removed leaving the resultant structure shown in FIG. 7K. A plan view of the array 60 of ROM cells is shown in FIG. 7L with the position of the extension or halo regions shown as "storage nodes."

It should be noted that the implant step shown and described in FIG. 7H may be accomplished one of two methods. Each column side of each crossing between the gate 116 and columns 62/64/66/68 is a potential programming point or "bit" (i.e. either the first or third portion of the channel 36 in FIG. 4a). An opening in the resist above one of these points allows the implant to program the bit. In the first method, the resist opens each side of a device selectively over each bit to be programmed. This requires holes whose dimension parallel to the polysilicon strips 116 is half of the column pitch. Thus, for example, as shown in FIG. 7H, the photoresist covers the region labeled "A", but is unmasked in the region labeled "B". The implant is done at a direction normal to the plane of the surface of the semiconductor substrate 20. Therefore, region "B" will be implanted. In the second method, the implant occurs at an angle other than being normal to the plane of the substrate 20. As a result, if the resist opens both sides of a device and with an angle implant, only one device gets implanted at a time. Although two programming points are exposed, one side is shadowed by the angle of the implant and is therefore not programmed. For example, if the resist covered the oxide 100 between columns 66/64 and implant occurs at an angle from "right" to "left", because region "B" is shielded by the resist above the oxide 100, it would not be implanted. However, region "C" would be implanted. The implant and masking step must be done twice, once with the implant angled toward one side or the other. The advantage is that the lithography requirement is for holes whose dimension parallel to the polysilicon strips 116 is equal to the column pitch. From the foregoing, it can be seen that an array 60 of the ROM cells 50 or 150 will not have any contact regions within the array. Thus, the array 60 can be made very compact and dense. In addition, with each ROM cell being of multi-bit, the density of the array 60 can be further increased.

What is claimed is:

1. A method of making an array of Read Only Memory (ROM) cells arranged in a plurality of columns and rows in a semiconductor substrate of a first conductivity type having a first concentration, wherein said array of ROM cells having a plurality of ROM cells in each column and a plurality of ROM cells in each row, wherein ROM cells in adjacent columns share a common column line with each ROM cell defined by a first column line, a second column line with a channel therebetween, said channel having three portions: a first portion adjacent said first column line, a third portion adjacent said second column line and a second portion between said first portion and said third portion, and a gate for controlling the conduction of charges in said channel; said method comprising:

implanting said substrate to form a plurality of spaced apart first regions of a second conductivity type, parallel to one another, in said column direction, in said substrate, wherein each first region being said common column line between adjacent columns of ROM cells;

masking said array:

1) to permit implanting a first select of said ROM cells wherein for each ROM cell, implant would occur in an extension region adjacent to its associated first column line by a conductivity type or a concentration different from said first conductivity type and said first concentration to form a first state of said ROM cell; or 2) to permit implanting a second select of said ROM cells wherein for each ROM cell, implant would occur in an extension region adjacent to its associated second column line by a conductivity type or a concentration different from said first conductivity type and said first concentration to form a second state of said ROM cell; or 3) to permit implanting a third select of said ROM cells wherein for each ROM cell, implanting would occur in an extension region adjacent to its associated first column line by a conductivity type or a concentration different from said first conductivity type and said first concentration, and in an extension region adjacent to its associated second column line by a conductivity type or a concentration different from said first conductivity type and said first concentration, to form a third state of said ROM cell; or 4) to permit no implanting a fourth select of said ROM cells, wherein for each ROM cell, no implanting would occur either in an extension region adjacent to its associated first column line or in an extension region adjacent to its associated second column line, to form a fourth state of said ROM cell; and implanting said array masked to form said first, second, third or fourth state of said ROM cells; and masking said array to permit implanting a fifth select of said ROM cells wherein for each ROM cell, implanting would occur in its associated second portion of said channel for setting the threshold voltage of said cell to one of a plurality of possible voltages; and implanting said array to set the threshold voltages for said fifth select of said ROM cells.

* * * * *